United States Patent
Mischenko et al.

[11] Patent Number: 5,980,268
[45] Date of Patent: *Nov. 9, 1999

[54] DUAL BEAM CONTACT

[75] Inventors: Nicholas Mischenko, Mt. Prospect; Keith A. Gronczewski, Des Plaines, both of Ill.

[73] Assignee: Motorola, Inc., Schaumburg, Ill.

[ * ] Notice: Under 35 U.S.C. 154(b), the term of this patent shall be extended for 701 days.

[21] Appl. No.: 08/489,696

[22] Filed: Jun. 12, 1995

Related U.S. Application Data

[63] Continuation of application No. 08/172,656, Dec. 23, 1993, abandoned.

[51] Int. Cl.$^6$ .................................................. H01R 9/09
[52] U.S. Cl. .................................................................. 439/66
[58] Field of Search ............................... 439/66, 71, 929, 439/500, 625

[56] References Cited

U.S. PATENT DOCUMENTS

| | | |
|---|---|---|
| 3,551,750 | 12/1970 | Sterling ................................ 439/66 X |
| 3,858,154 | 12/1974 | William . |
| 3,982,159 | 9/1976 | Dennis et al. . |
| 3,993,384 | 11/1976 | Dennis et al. . |
| 4,052,118 | 10/1977 | Scheingold et al. ............... 439/71 OR |
| 4,068,915 | 1/1978 | Evans . |
| 4,285,562 | 8/1981 | Teagno et al. . |
| 4,327,956 | 5/1982 | Sitzler . |
| 4,394,059 | 7/1983 | Reynolds ......................... 439/500 OR |
| 4,416,504 | 11/1983 | Sochor . |
| 4,460,237 | 7/1984 | Brown et al. . |
| 4,480,386 | 11/1984 | Adams . |
| 4,533,187 | 8/1985 | Kirkman . |
| 4,553,192 | 11/1985 | Babuka et al. ......................... 439/66 X |
| 4,623,207 | 11/1986 | Sasaki et al. . |
| 4,685,886 | 8/1987 | Denlinger et al. ...................... 439/55 |
| 4,735,585 | 4/1988 | Palmer, III et al. .................... 439/701 |
| 4,738,625 | 4/1988 | Burton et al. ......................... 439/66 X |
| 4,820,182 | 4/1989 | Harwath et al. ........................ 439/290 |
| 5,199,554 | 4/1993 | Kano et al. . |

*Primary Examiner*—Paula Bradley
*Assistant Examiner*—Daniel Wittels
*Attorney, Agent, or Firm*—John J. King; Daniel R. Collopy

[57] ABSTRACT

A unique dual beam contact (30) for coupling elements on opposite sides of a dividing element (68) preferably comprises a single piece of metal or other conductive material to provide a contact portion on either side of the dividing element (14). Each beam of the dual beam contact can be specifically shaped or formed to provide the preferred contact pressure depending upon the application the dual beam contact. The dual beam contact includes an attachment member (34, 35) to provide easy attachment to an element of the device. Alternatively, the elbow portion (38) between the two beams could be used to attach the dual beam contact to the dividing element. The dual beam contact of the present invention reduces cost, inventory requirements, and complexity in manufacturing.

3 Claims, 2 Drawing Sheets

DUAL BEAM CONTACT

This is a continuation of application Ser. No. 08/172,656, filed Dec. 23, 1993 and now abandoned.

FIELD OF THE INVENTION

The present invention relates to a contact element, and more particularly to a dual beam contact for use in an electronic device.

BACKGROUND OF THE INVENTION

In an electronic device, such as a portable cellular telephone, there are often a number of elements, such as circuit boards, housing elements, or a detachable battery which are combined to form the device. There is often a need to make a connection between contact elements which may not be adjacent, but on opposite sides of a barrier. For example, it may be required to connect a contact of a detachable, rechargeable battery to a contact of a circuit board which is on the other side of a barrier, such as a housing or another circuit board. Accordingly, a connection must be made through the barrier by way of an aperture in the barrier.

As shown in FIG. 1, a conventional apparatus to make such a connection comprises a first contact beam 10 and a second contact beam 12 coupled to a dividing element 14. Dividing element 14 could be any barrier in the device, such as a circuit board employed in the device or a housing for the device. The contact beams could be coupled, for example, by a screw 16 and a nut 18 through an aperture 19 in dividing element 14. The first contact beam 10 generally includes a connecting portion 20 adapted to receive screw 16. The first contact beam also includes an elbow portion 22 and a contact portion 24 for making contact to an element on one side of dividing element 14. The second contact beam 12 also includes a connecting portion 26 adapted to receive screw 16, and a contact portion 28 for providing a connection to an element on the other side of dividing element 14.

As can be seen from the prior art device shown in FIG. 1, a number of components are required to implement the connection between contact elements above and below dividing element 14. However, such components increase cost, complexity, part count, and manufacturing time. However, it is desirable to reduce cost, number of parts, and complexity in manufacturing.

Accordingly, there is a need for a device to make a connection to contacts on opposite sides of a dividing element.

DETAILED DESCRIPTION OF THE PREFERRED EMBODIMENTS

The present invention is directed to a dual beam contact for coupling elements on opposite sides of a dividing element. The device preferably comprises a single piece of metal or other conductive material to provide a connection to a contact element on either side of the dividing element. Each beam of the dual beam contact can be specifically shaped or formed, or have a specific composition, to provide the preferred contact pressure depending upon the application.

Figure 1:
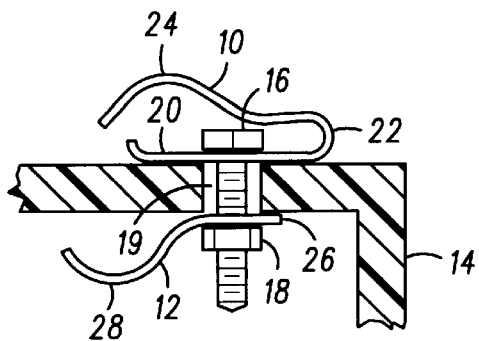
FIG. 1 is a cross-sectional view of a conventional contact element for coupling components of a device on opposite sides of a dividing element.
Figure 2:
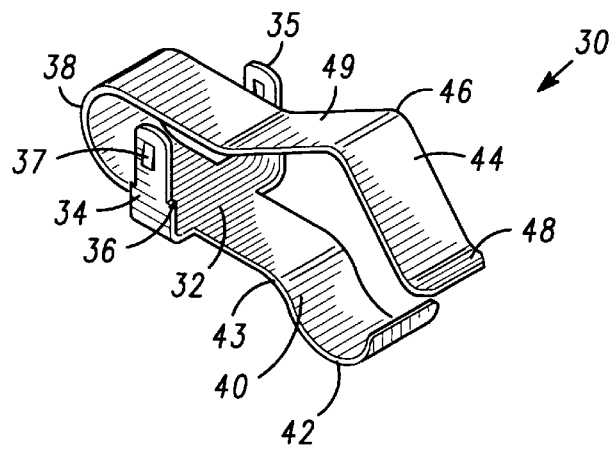
FIG. 2 is a perspective view of a dual beam contact according to the present invention.

Turning to FIG. 2, a dual beam contact according to the present invention is shown. Dual beam contact 30 comprises a base portion 32 having a first attachment member 34 and a second attachment member 35 adapted to secure the dual beam contact 30 to an element of the device. As will be shown in detail in FIG. 3, the dual beam contact is preferably attached to the dividing element, although it could be attached to some other element in the device. Each attachment member preferably includes shoulder portions 36 for restricting the depth to which the attachment member can be inserted into a receiving member in the dividing element. Each attachment member also preferably includes a locking tab 37 for maintaining the attachment member within the receiving member.

Dual beam contact 30 further includes an elbow 38 bridging the first contact beam 40 having a first contact portion 42 with the second contact beam 44. Second contact beam 44 includes a contact portion 46 and a distal end portion 48. The pressure applied by a contact portion of either of the beams can be adjusted by the curvature of the beam. While the contact beams may be symmetrical, the contact beams may be shaped to provide different contact pressures as desired. For example, the contact pressure applied by contact portion 46 of second contact beam 44 can be selected by adjusting the curvature of the inclined portion 49. The spring-like action of contact beam 44 will generally provide greater pressure than contact beam 40 having a generally flat portion 43 leading to contact portion 42. However, other shapes of the contact beams are contemplated within the scope of the present invention. Also, other factors such as thickness or composition of materials could be utilized to adjust the contact pressure of a contact beam, depending upon the specific application of the dual beam contact.

Figure 3:
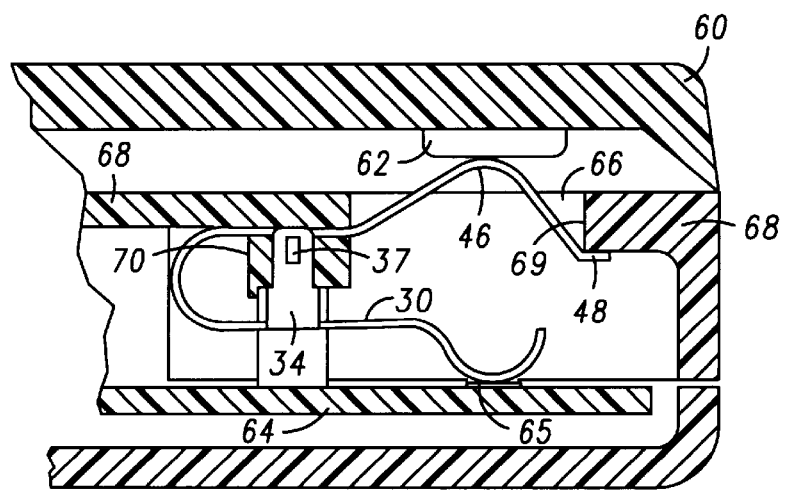
FIG. 3 is a cross-sectional view of a device incorporating the dual beam contact of FIG. 2.

Turning now to FIG. 3, an exemplary application of the dual beam contact is shown. For example, a battery operated portable device such as a cellular telephone or other communication equipment could incorporate the dual beam contact of the present invention. The device of FIG. 3 shows a device having a battery 60 and battery contact 62. Generally, the device includes a circuit board 64 having a contact 65. Dual beam contact 30 is employed to make a contact between battery contact 62 and contact pad 65 on the circuit board 64 by way of an aperture 66 in divider 68. In the embodiment of FIG. 3, the dual contact beam is generally positioned below the dividing element, wherein contact portion 46 extends through aperture 66 to make a connection to contact 62 above the dividing element.

Dual beam contact 30 is preferably attached to divider 68 by way of a receiving member 70. That is, attachment members 34 and 35 are inserted into respective receiving members 70, and retained by locking tabs 37. This arrangement allows for independent movement of the contact beams. Distal end 48 is lodged under an end portion 69 of aperture 66 to maintain the proper alignment of the dual beam contact within the device. By way of example, divider 68 could be an inner housing adapted to enclose the device when the battery is detached. However, it will be understood the dual contact beam need not be attached to divider 68, but could be attached to some other element of the device. While the dual beam contact as shown in FIG. 3 makes a connection between the battery and a circuit board, the dual contact beam could make a connection according to the present invention between two circuit boards or other elements having an electrical contact.

Figure 4:
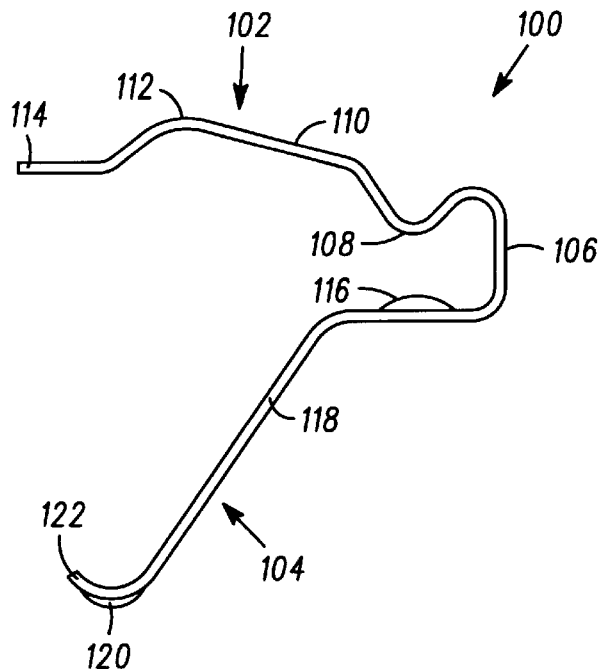
FIG. 4 is a cross-sectional view of an alternate embodiment of a dual beam contact according to the present invention.

Turning now to FIG. 4, an alternate embodiment 100 of the dual beam contact is shown. In particular, the dual beam contact is similar in shape to the first embodiment shown in FIG. 2, but generally includes different attachment means. Dual beam contact 100 includes an upper contact beam 102 and a lower beam contact 104 separated by an elbow 106. Upper contact beam 102 includes an attachment member 108 adapted to attach the dual beam contact to a dividing member, as shown in detail in FIG. 5. Attachment member 108 could extend the width of the contact beam as shown, or could merely be a dimple, barb or other protrusion. Attachment member 108 could apply pressure to the dividing member, or could optionally fit in a receiving portion on the top side of a dividing member. Dual beam contact 100 also includes an inclined portion 110 which leads to a contact portion 112 near a distal end portion 114.

Lower contact beam 104 includes a dimple 116 which could also optionally be adapted to fit into a receiving portion on the bottom side of the dividing portion. Although shown as a dimple which does not necessarily extend the width of the dual contact beam, element 116 could extend the width of the contact portion. Lower contact beam includes an inclined portion 118 leading to a contact element 120 at the distal end 122. While contact 122 is shown as a dimple, the contact could for example be a barb or of some other shape to make a good contact. As set forth in the description of the embodiment of FIG. 2, the specific shape of either contact can be adjusted to modify the pressure applied by the particular contact. Also, the composition of the materials can be selected as desired.

Figure 5:
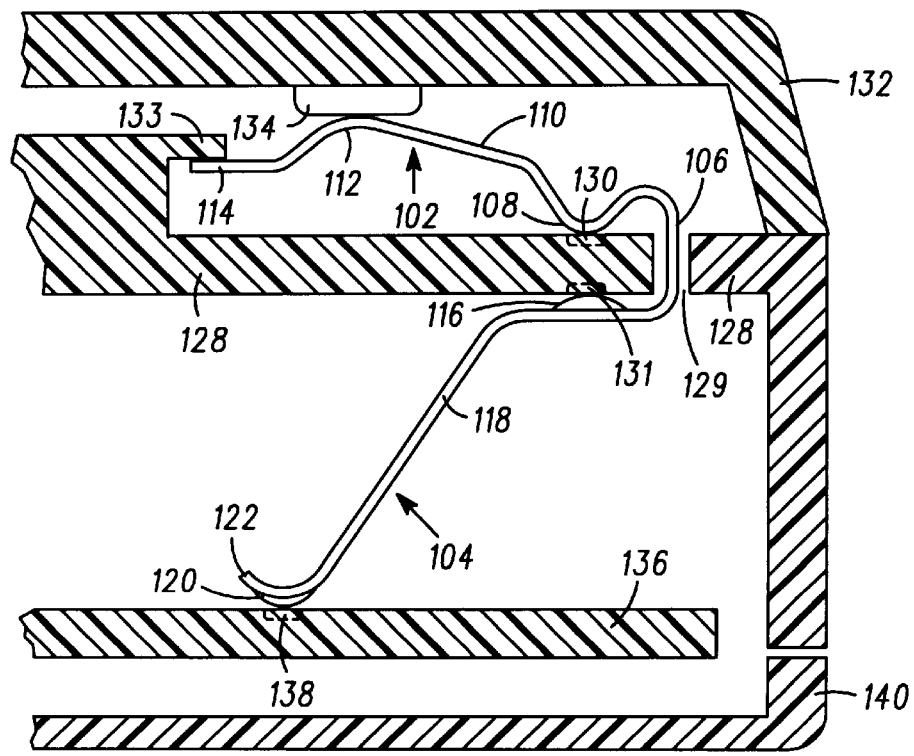
FIG. 5 is a cross-sectional view of a device incorporating the dual beam contact of FIG. 4.

Turning now to FIG. 5, an exemplary application of the embodiment of FIG. 4 is shown. In particular, dual contact beam 100 can be used to provide a connection between contacts on opposite sides of a dividing element 128 by extending through an aperture 129 in dividing element 128. That is, the entire upper contact beam 102 may be positioned above the dividing element 128 and the entire lower contact beam 104 may be positioned below the lower contact beam, wherein the elbow portion 106 acts as an attachment member. Dividing element 128 could optionally include a receiving element 130 for receiving attachment element 108 and a receiving element 131 for receiving attachment element 116. However, it will be understood that the dual beam contact could be shaped to fit around dividing element 128 without any attachment members or receiving portions.

As shown in FIG. 5, the dual contact beam of FIG. 4 could also be incorporated in an electronic device, such as a cellular telephone. For example, upper contact 112 could be coupled to a detachable battery 132 having a contact 134. Also, contact portion 120 could be coupled to a circuit board 136 having a contact element 138. Attachment members 108 and 116 generally apply pressure (or fit into receiving members in dividing element 128) to attach the dual contact beam to dividing element 128. Dividing element 128 can be shaped to retain distal end 114 of upper contact beam 102 under a flange 133. Finally, an outer housing 140 can be use to enclose the device.

In summary, the present invention comprises a dual beam contact for coupling elements on opposite sides of a dividing element. The device preferably comprises a single piece of metal or other conductive material to provide a contact portion on either side of the dividing element. An entire contact beam or a portion thereof can extend through the aperture to make a contact on one side of the dividing element. Each beam of the dual beam contact can be specifically shaped or formed or a specific composition to provide the preferred contact pressure depending upon the application the dual beam contact. The dual beam contact may include an attachment member to provide easy attachment to an element of the device, or utilize the elbow portion adjoining the two contact beams to attach the dual beam contact to the dividing element. The dual beam contact of the present invention reduces the number of components and the cost of manufacturing an electronic device.

What is claimed is:

1. A single piece, dual beam contact for making an electrical connection on opposite sides of a dividing element through an aperture of said dividing element in an electronic device, the dual beam contact comprising:

a first contact beam adapted to be positioned on a first side of said dividing element to make a connection to a first contact element of said electronic device on said first side of said dividing element, said first contact beam having a distal end portion adapted to be secured under a flange in said dividing element;

a second contact beam adapted to be positioned through said aperture on a second side of said dividing element to make a connection to a second contact element on said second side of the dividing element;

an elbow portion coupled between said first contact beam and said second contact beam, said elbow portion being adapted to extend through said aperture in said dividing element to attach said dual beam contact to said dividing element;

a first attachment member adapted to attach said dual beam contact to said; dividing element at said first side of said dividing element; and a second attachment member adapted to attach said dual beam contact to said dividing element at said second side of said dividing element.

2. The dual beam contact of claim 1 wherein said first contact beam includes a contact portion adapted to make a connection to said first contact element on said first side of said dividing element.

3. The dual beam contact of claim 1 wherein said second contact beam includes a contact portion adapted to make a connection to said second contact element on said second side of said dividing element.

* * * * *